United States Patent
Gaskins et al.

(10) Patent No.: US 7,296,143 B2
(45) Date of Patent: Nov. 13, 2007

(54) METHOD AND SYSTEM FOR LOADING PROCESSOR BOOT CODE FROM SERIAL FLASH MEMORY

(75) Inventors: William S. Gaskins, Durham, NC (US); Kevin M. Jackson, Cary, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 390 days.

(21) Appl. No.: 10/873,682

(22) Filed: Jun. 22, 2004

(65) Prior Publication Data

US 2005/0283598 A1 Dec. 22, 2005

(51) Int. Cl.
*G06F 9/00* (2006.01)

(52) U.S. Cl. .................. 713/2; 713/1; 713/100; 711/104

(58) Field of Classification Search ............ 713/1, 713/2, 100; 711/104
See application file for complete search history.

(56) References Cited

U.S. PATENT DOCUMENTS

| | | | |
|---|---|---|---|
| 5,210,875 A | 5/1993 | Bealkowski et al. | |
| 5,355,489 A | 10/1994 | Bealkowski et al. | |
| 5,671,413 A | 9/1997 | Shipman et al. | |
| 5,835,760 A | 11/1998 | Harmer | |
| 5,897,663 A * | 4/1999 | Stancil .................. | 711/200 |
| 5,918,047 A | 6/1999 | Leavitt et al. | |
| 5,987,536 A | 11/1999 | Johnson et al. | |
| 6,055,631 A | 4/2000 | Chadha | |
| 6,061,745 A | 5/2000 | Mahmoud | |
| 6,154,837 A | 11/2000 | Fudeyasu et al. | |
| 6,216,225 B1 | 4/2001 | Yoo | |
| 6,282,643 B1 | 8/2001 | Cromer et al. | |
| 6,370,645 B1 | 4/2002 | Lee | |
| 6,425,079 B1 | 7/2002 | Mahmoud | |
| 6,446,203 B1 | 9/2002 | Aguilar et al. | |
| 6,456,517 B2 | 9/2002 | Kim et al. | |
| 6,513,114 B1 | 1/2003 | Wu et al. | |
| 2001/0029575 A1* | 10/2001 | Pascucci ................... | 711/167 |
| 2002/0015249 A1* | 2/2002 | Takayama et al. ............ | 360/48 |
| 2002/0120709 A1* | 8/2002 | Chow et al. ................ | 709/213 |
| 2004/0117565 A1* | 6/2004 | Brant et al. .................. | 711/154 |
| 2004/0177215 A1* | 9/2004 | Nagamasa et al. .......... | 711/103 |
| 2004/0268042 A1* | 12/2004 | Okada et al. ................ | 711/115 |
| 2005/0080987 A1* | 4/2005 | Zitlaw ........................ | 711/104 |

FOREIGN PATENT DOCUMENTS

WO 0314923 8/2001

OTHER PUBLICATIONS

Samsung Electronics, User's Manual S3C2410X, 32-Bit RISC Microprocessor, Revision 1.2, Chapters 1-6.
Infineon Technologies, Application Note, VI, AP3230 Boot ROM Code, TC11Ib, 32bit, pp. 1-42.

* cited by examiner

*Primary Examiner*—Thomas Lee
*Assistant Examiner*—Malcolm D Cribbs
(74) *Attorney, Agent, or Firm*—Sawyer Law Group LLP

(57) ABSTRACT

Method and system for loading processor boot code from a serial flash memory device. A code fetch request is received from a processor, the code fetch request requesting a portion of boot code to be executed by the processor. The code fetch request is translated into a memory request providing random access to the serial flash memory device, and the memory request is sent to the serial flash memory. The portion of boot code is read from the serial flash memory device and provided to the processor.

44 Claims, 7 Drawing Sheets

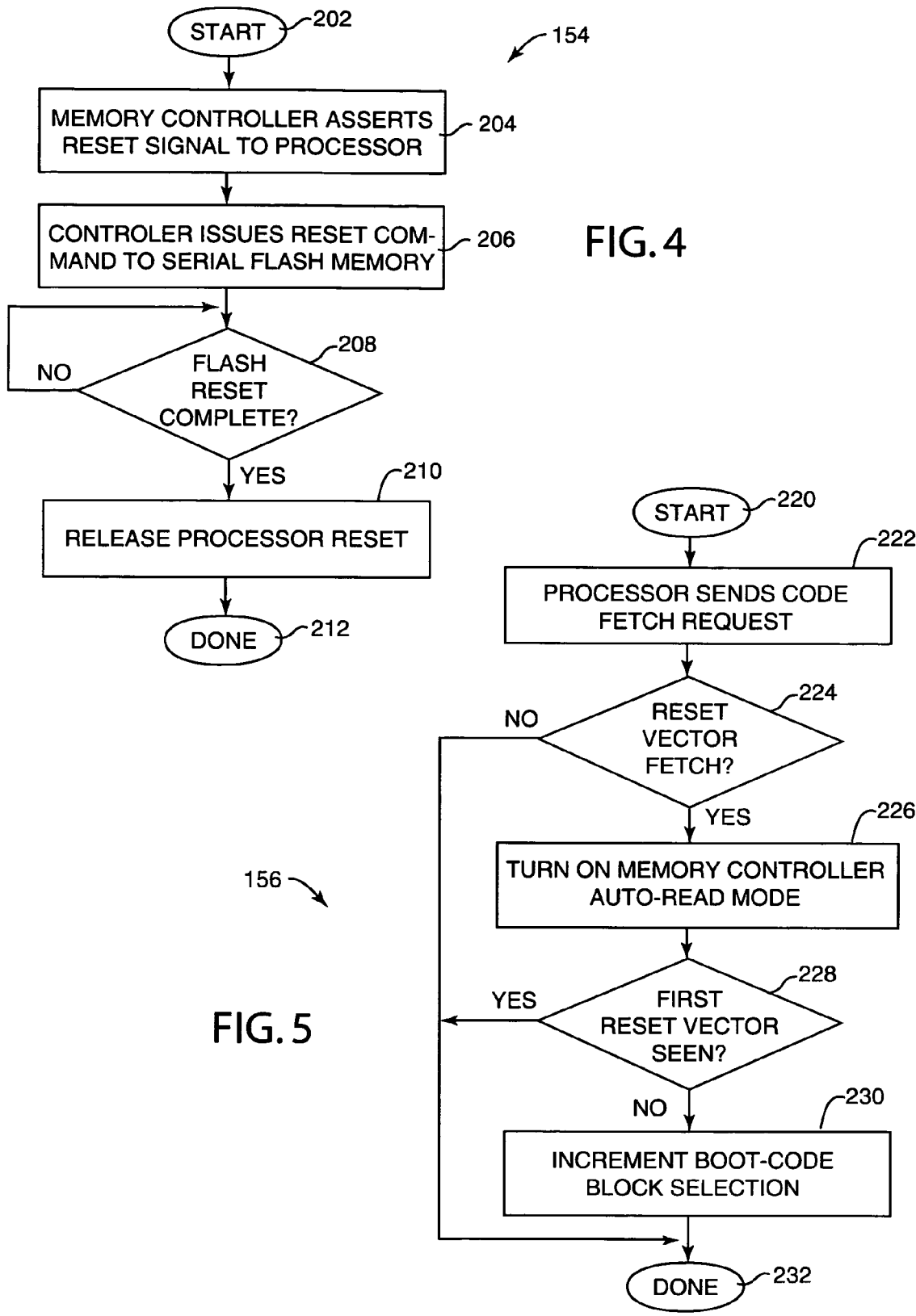

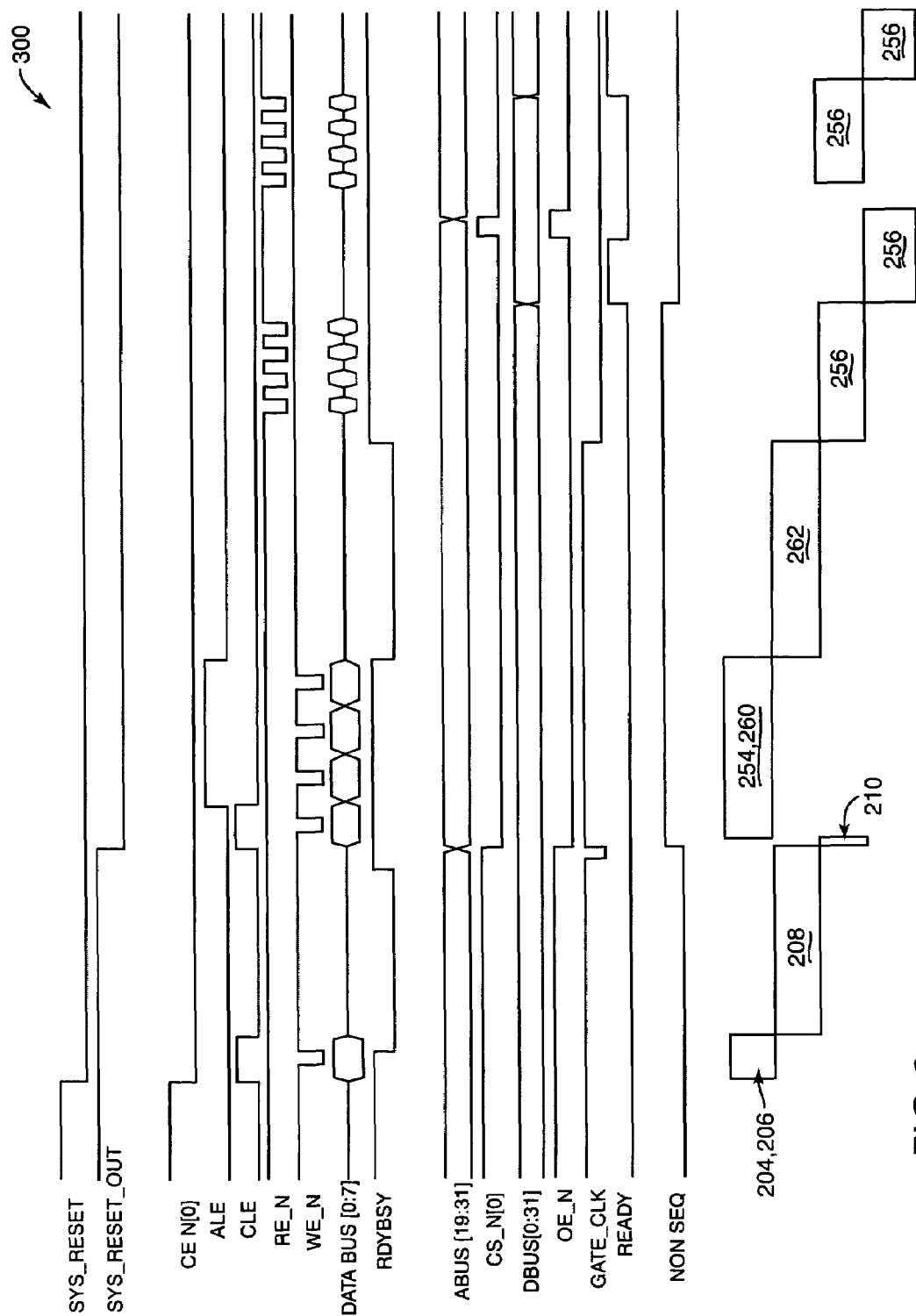

METHOD AND SYSTEM FOR LOADING PROCESSOR BOOT CODE FROM SERIAL FLASH MEMORY

FIELD OF THE INVENTION

The present invention relates to memory devices, and more particularly to the loading of boot code to processors from a serial flash memory upon start-up of a processor system.

BACKGROUND OF THE INVENTION

All microprocessors need to execute their first instructions, or "boot code," after power-up or system reset from a non-volatile memory or other storage location which retains its data when power is off. Most current applications use a form of read-only memory (ROM) as their non-volatile memory to store the boot code, such as basic low-level operating system code (basic input/output system, BIOS). Such forms of ROM may be devices which can be written to a single time, such as Erasable Programmable Read Only Memory (EPROM), or devices which are in-system and re-programmable several times, such as traditional Electrically Erasable Programmable Read Only Memory (EEPROM), or a traditional flash device, often called NOR-Flash memory, which can erase entire blocks or sections of memory at once. These types of storage devices provide a simple Static Read Only Memory (SRAM) type interface, where an address is presented to the device and the data corresponding to the address is returned from the device after a short access delay time. This simple type of memory allows the boot code and low-level operating system code to be written to take full advantage of non-sequential execution (loops, if-then-else, branches, etc.) of code that is available on all processors.

As embedded processor systems more commonly rely on larger low-level operating systems to function, the storage requirements for the operating system code is outgrowing the capacity of traditional NOR-Flash and ROM non-volatile memory architectures. This has led to the increasing use of higher density NAND-based flash memories to contain the image of the operating system needed for an embedded processor system. NAND-flash memory devices are another type of non-volatile flash memory which have an advantage over the other types of non-volatile memory mentioned above: they store more data for the same silicon area. Thus, more non-volatile storage is available for the same cost and board area in comparison with the traditional non-volatile memory devices.

However, there are several difficulties associated with using NAND-Flash memory devices. NAND-Flash devices are controlled through commands instead of a simple SRAM interface, and thus must receive a specific command telling them to start to read data and then receive a command address to tell where that data should be fetched from. Furthermore, NAND-Flash is optimized for sequential (serial) access instead of the random access that is required for execution of software code from the memory; in comparison, NOR-Flash memory supports high-speed random access reads with parallel memory cell architecture. Thus, NAND-Flash devices have a restriction that, in order to get fast data read cycle times (e.g., 50 nanoseconds per byte), the data must be accessed sequentially. When a non-sequential piece of data is requested, there is a much larger access time (e.g., 50 microseconds) before the new data is available.

When accessing NAND-Flash for data, a command is first written to the NAND-Flash device to tell the device to enter a read mode, and then an address is written to the device to tell it where in the memory the processor wants to start to read data. Then, the NAND-Flash device drives a "busy" indicator signal until the desired page of data is available for reading. The time that this process takes is typically known as the "page read access time." Once the NAND-Flash has dropped its busy indicator, the processor can begin to read data from the NAND-Flash in a sequential fashion (byte 0, byte 1, byte 2, etc.) for up to an entire device page size. The processor cannot make another random access to the NAND-Flash device unless it sends another command to the device and waits again for the page read access time to expire.

Thus, the interfacing requirements described above for NAND-Flash typically prevent this type of memory from being used for boot code/BIOS execution. However, some prior implementations have used NAND-Flash devices for such an application. For example, some NAND-Flash devices provide a strapping input pin called Power-On Read Enable (PRE) that automatically puts the NAND-Flash device into a sequential read mode. Since all accesses to NAND-Flash must be made in a sequential order, the software reset vector and initial program code must be "un-rolled" so that the order that the processor will fetch the code is the same order that the code is stored into the NAND-Flash device. This un-rolling can be complicated and requires in-depth knowledge of how the processor fetches code. Also, any branches or loops that may be present in the initial program code must be mapped into a linear sequence of operations in the external NAND-Flash device.

Another solution that has been used in some embedded processor designs is a circuit that automatically copies some amount of program code and/or data from the external NAND-Flash device into an on-chip SRAM. After this copy operation is completed, this circuit allows the processor to begin fetching its reset vector and boot code from the on-chip SRAM source, where random accesses are easily accomplished. The disadvantage of this method is that it requires that the chip design incorporate a fairly large amount of SRAM in order to have enough on-chip storage to contain all the code of the operating system. Additionally, this on-chip SRAM is typically not needed after boot time and wastes power and silicon die area after the initial boot-up is completed.

Accordingly, what is needed is a system and method that allows the execution of boot code directly from a serial memory device, such as a NAND-Flash device, and allows that memory device to store the operating system. The present invention addresses such a need.

SUMMARY OF THE INVENTION

The invention of the present application relates to a system and method for loading processor boot code from a serial flash memory device. In one aspect of the invention, a method for loading boot code from a serial flash memory includes receiving a code fetch request from a processor, the code fetch request requesting a portion of boot code to be executed by the processor. The code fetch request is translated into a memory request providing random access to the serial flash memory, and sending the memory request to the serial flash memory. The portion of boot code is read from the serial flash memory and provided to the processor. A similar aspect of the invention provides a memory controller including elements for implementing similar features.

In a second aspect of the invention, a method for loading boot code for a processor system includes enabling an auto-read mode for a memory controller after reset of the processor system, the auto-read mode allowing the memory controller to control sequential and random accesses from a processor to a serial flash memory that stores the boot code, and disabling the auto-read mode of the memory controller when sufficient boot code has been retrieved and executed by the processor to allow the processor to retrieve and store other data from the serial flash memory.

In a third aspect of the invention, a processor system includes a processor, a serial flash memory device that stores boot code for initializing the processor system after a system reset; and a memory controller coupled between the processor and the serial flash memory device. The memory controller provides data from the serial flash memory device to the processor in response to sequential- and random-access boot-code fetch requests sent by the processor.

The present invention allows random-access requests for boot code directly from a serial flash memory device. The system can thus take advantage of the high storage capability of these types of memory devices without having to include additional costly memory devices such as SRAM, and without having to store boot code in a sequential fashion according to the order of processor requests. This also allows a single memory device to store both the boot code and the operating system, thus reducing parts count and hence the total cost of the final system.

BRIEF DESCRIPTION OF THE DRAWINGS

FIG. 4 is a flow diagram illustrating a step of the method of FIG. 3 in which the memory controller prepares the processor and serial flash memory device in the boot-up procedure;

FIG. 5 is a flow diagram illustrating a step of the method of FIG. 3 in which the memory controller receives and performs part of the processing for a code fetch request from the processor;

FIG. 8 is a diagrammatic illustration of the timing of signals used in an example embodiment of the present invention.

DETAILED DESCRIPTION OF THE INVENTION

The present invention relates to the loading processor boot code from a serial flash memory. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is mainly described in terms of particular systems provided in particular implementations. However, one of ordinary skill in the art will readily recognize that this method and system will operate effectively in other implementations. For example, the processor systems usable in the present invention can take a number of different forms and include different components. The present invention will also be described in the context of particular methods having certain steps. However, the method and system operate effectively for other methods having different and/or additional steps not inconsistent with the present invention.

PRIOR ART

Figure 1:
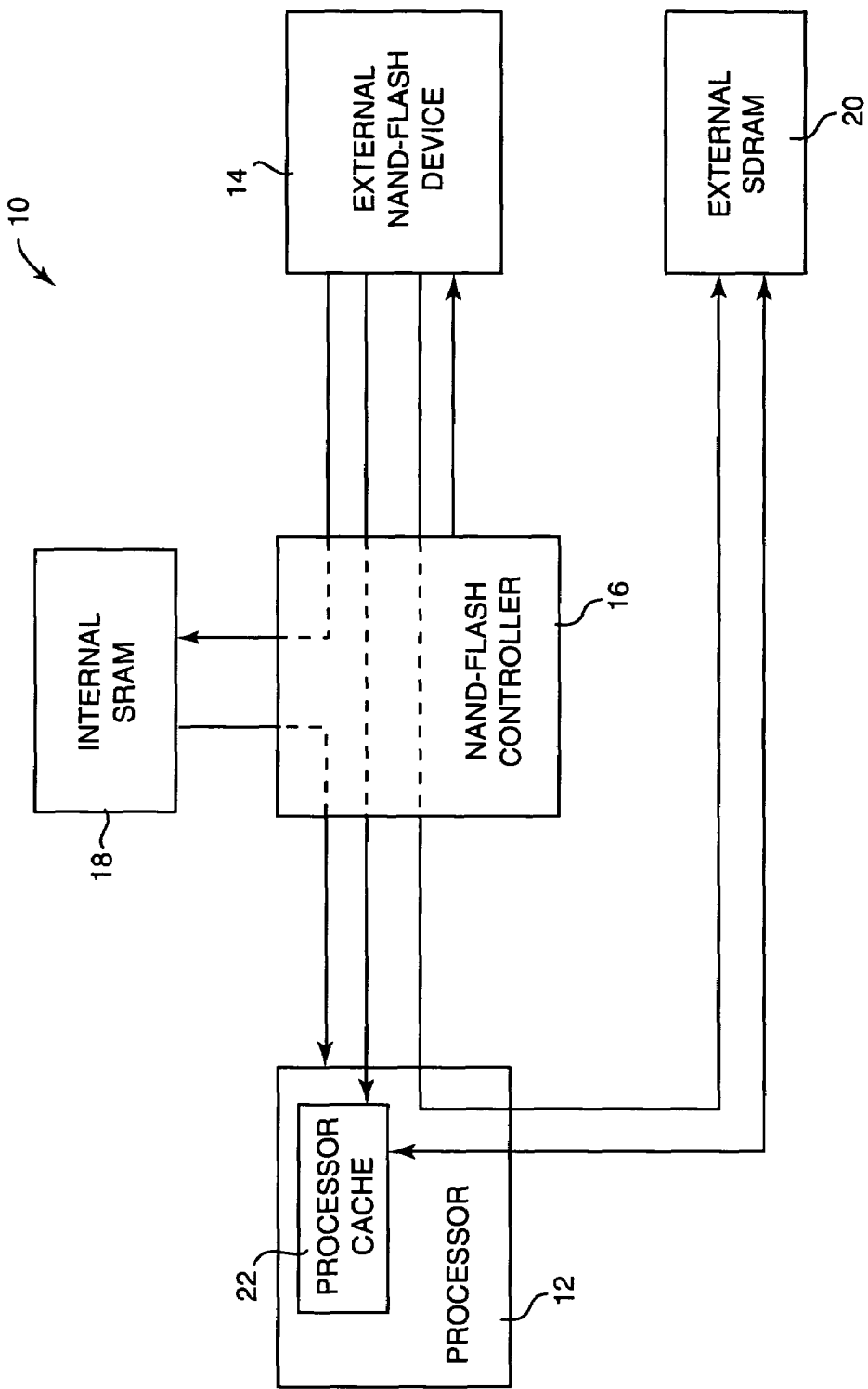
FIG. 1 is a block diagram illustrating a processor system of the prior art.

FIG. 1 is a block diagram of an example prior art processor system 10 for reading boot code and other data stored in a NAND-Flash device. System 10 includes a processor 12, an external NAND-Flash memory device 14, a NAND Flash Controller (NDFC) 16, an internal SRAM 18, and an external SDRAM 20. NDFC 16 is used to automatically copy an amount of boot code from the external NAND-Flash device 14 into the internal (on-chip) SRAM 18, where the processor can then retrieve it using random accesses. First, the NDFC 16 issues commands to the NAND-Flash device to reset the device to put it into a known state, and then issues a command to put the device into a sequential read mode for the block of data in which a small initial program loader (IPL) is located. Typically, the IPL is on the order of 512 bytes of code, corresponding to one data page size for the NAND-Flash device 14.

Next, the NDFC 16 automatically copies the IPL code from the NAND Flash device 14 into the internal SRAM 18 that is coupled to the NDFC. The processor is then released from its "reset" state and is directed to execute the IPL from the SRAM 18. Since the IPL is running from a random access memory, the processor is unconstrained when executing jumps and loops in the IPL code. The execution of the IPL code allows the processor to read a larger secondary program loader (SPL) from the NAND-Flash device 14 into the processor's internal cache 22. The SPL can be larger than the IPL and up to the size of the processor's instruction cache. The processor 12 then executes the SPL code from the internal cache 22 to cause the operating system code to be loaded out of NAND-Flash device 14 and copied to external SDRAM 20, where the operating system code can be executed (once the SPL is completed). The operating system code is several orders of magnitude larger than the IPL/SPL code, and can also be stored in compressed form in the NAND-Flash device 14; the SPL would have to uncompress such compressed code before copying the operating system code to external SDRAM 20. If the size of internal SRAM 18 is made larger, than it is possible for both the IPL and the SPL to be combined into one piece of code that is loaded into internal SRAM 18 prior to allowing the processor to execute the IPL/SPL instructions.

This prior art embodiment requires that the chip design incorporate a large amount of SRAM in order to have enough on-chip storage to contain all the code of the operating system from the external NAND-Flash device, which is disadvantageous from a cost perspective. Additionally, this on-chip SRAM is typically not needed after boot time and wastes power and silicon die area after the initial boot-up is completed.

A different prior art embodiment that allows boot code to be read from a NAND-Flash device provides a strapping input pin called Power-On Read Enable (PRE) that automatically puts the NAND-Flash device into a sequential read mode whereby read accesses to the device will return data starting with block 0, page 0, byte 0. Since all accesses to NAND-Flash must be made in a sequential order, the software reset vector and initial program code must be "un-rolled" so that the order that the processor will fetch the code is the same order that the code is stored into the NAND-Flash device. This un-rolling can be complicated and requires in-depth knowledge of how the processor fetches code, including how processor-specific cache-line fill operations are presented to the external storage device. Also, any branches or loops that may be present in the initial program code (after the reset vector, which is always known to be a branch operation) must be mapped into a linear sequence of operations in the external NAND-Flash device.

EMBODIMENTS OF THE PRESENT INVENTION

Figure 2:
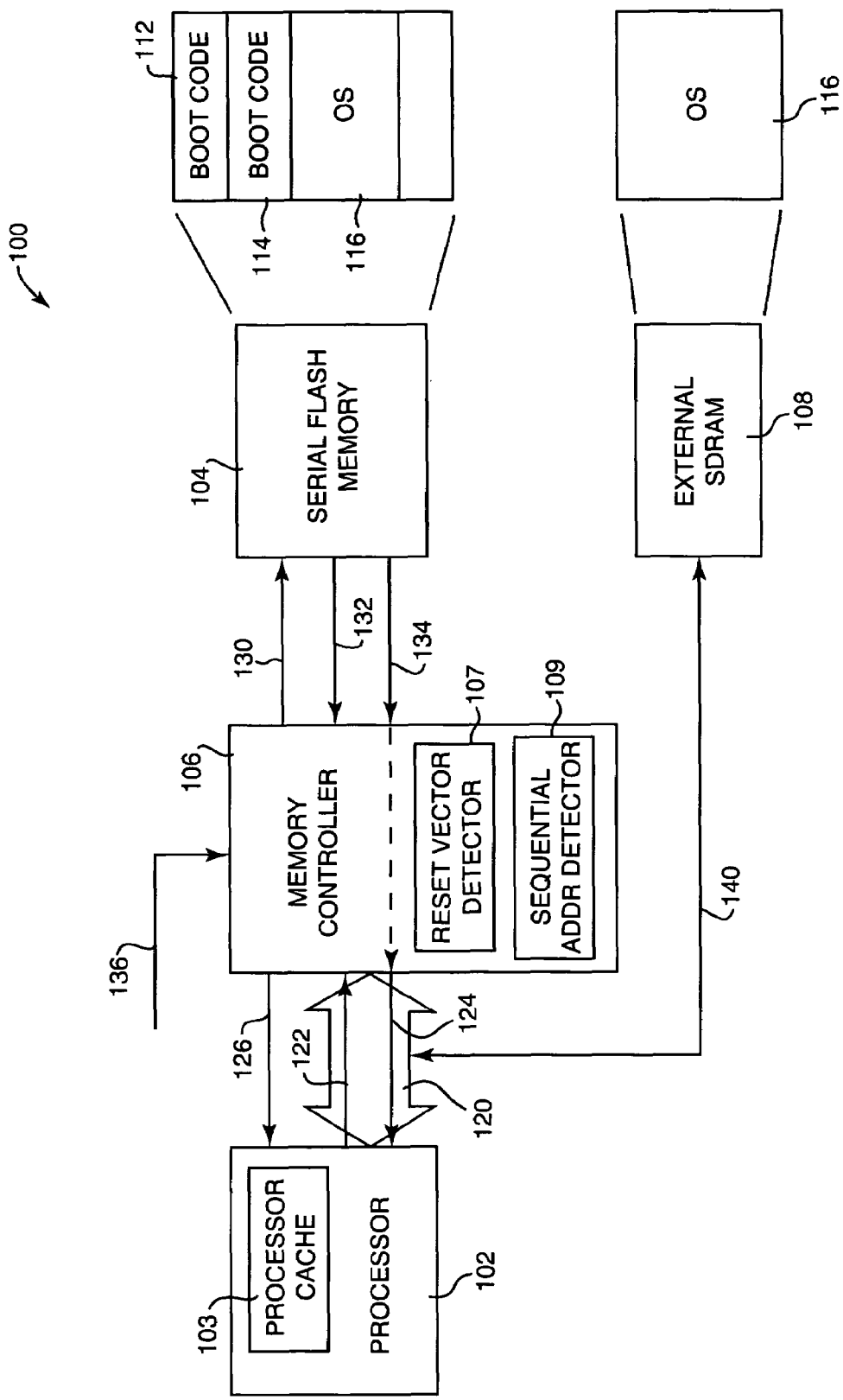
FIG. 2 is a block diagram illustrating a processor system of the present invention for loading processor boot code from a serial flash memory.

FIG. 2 is a block diagram of a processor system 100 of the present invention which allows boot code and other data to be loaded from a serial non-volatile flash memory device without the limitations of the prior art. Herein, a "serial flash memory" can be any flash memory device that is optimized for serial or sequential accesses, such as a NAND-Flash memory device, or the AND-Flash memory device available from Renesas Technology Corp. In addition, the term "data" is used generically, to refer to instructions, code, data, etc., and the term "random access" is intended to refer to non-sequential, or direct, accesses to memory.

System 100 includes a processor 102, serial flash memory device 104, memory controller 106, and external Synchronous Dynamic Random Access Memory (SDRAM) 108.

Processor system 100 can include an integrated circuit or chip which includes the processor 102 and the memory controller 106 as internal components, e.g., fabricated on the same integrated circuit die and in the same package. Other components, such as the serial flash memory device 104 and the external SDRAM 108, can be separate components having their own packages, and which are coupled to the processor 102 and/or controller 106 through an interface, external bus, etc. In other embodiments, the components can be otherwise configured or packaged. For example, the controller 106 can alternatively be provided in a package with the serial flash memory 104 instead of the processor package and interface with an external bus controller (EBC) provided internally to the processor die.

Processor 102 can be any of a variety of microprocessors, controllers, or similar devices. Processor 102 can include an internal cache 103 for storing instructions, data, or temporary data. The processor has a basic function in the context of the present invention of retrieving instructions (code) and data from memory and executing the instructions.

In the present invention, the code and data are stored in serial flash memory 104. For example, memory 104 can be a standard NAND-Flash memory device which is a non-volatile memory that has a serial or sequential access method. A command is written to the serial flash memory to cause it to enter a read mode, and then an address is written to the device to specify the location from which data is to be read. The serial flash memory device outputs a "busy" signal for a time duration (the "page read access time") until the desired page of data is available for reading, at which point data is read in a sequential fashion, byte by byte, for up to an entire device page size. If more than one page of data is required, another page read access to the serial flash memory device must be made by issuing another command and address to the serial flash memory and waiting again for the length of the page read access time.

In an application suitable for the present invention, the serial flash memory device 104 can store boot code, which are instructions that the processor 102 can execute to establish control over the processor system 100 and any devices connected thereto from an un-powered to a powered (start-up) state, or a reset state. In the present invention, however, the boot code need not be stored in a sequential fashion, where the processor fetches desired instructions that have been stored in the fetch order; the processor can read the boot code using random access fetches as required.

Boot code 112 can be stored in the serial flash memory 104 as the first set of boot code which is executed. A second set of boot code 114 can also be stored in the serial flash memory device 104 as a backup to boot code 112 to be used if boot code 112 includes errors or other problems; or as a different boot code set that provides alternate conditions and/or states to the processor system 100 when it is executed. Additional sets of boot code can also be stored in other embodiments.

Besides boot code sets 112 and 114, the operating system (OS) code or "image" 116 can also be stored in serial flash memory device 104. The OS code 116, when executed by processor 102, provides the operating system functions to the processor system 100 and the other components and devices connected to the processor system. Typically, the OS code is read by the processor 100 that is being governed by software such as device drivers that have been loaded by or included with the boot code 112 or 114 that was executed earlier from the serial flash memory 104.

Memory controller ("controller") 106 is provided between the processor 102 and the serial flash memory device 104 to mediate and translate signals between these two components. The controller 106 includes a reset vector detector 107 and a sequential address detector 109, which are described in greater detail below with respect to FIGS. 5 and 6, respectively. The controller 106 is coupled to the processor 102 by a processor bus 120, which provides a pathway 122 for the processor to send commands or data to the controller 106, and a pathway 124 for the controller 106 to send commands or data to the processor 102. Furthermore, the controller 106 can send a reset signal to the processor 102 on the processor reset line 126, which, while asserted, causes the processor 102 to remain in a reset mode in which it performs no functions and does not timeout or otherwise issue any requests on pathway 122.

The memory controller 106 is connected to the serial flash memory device 104 by several lines and buses, including a command bus 130 for sending commands from the controller 106 to the serial flash device 104, a status bus 132 for sending status signals to the controller informing of the state of the serial flash device 104, and a data bus 134 for providing data from the memory pages of the serial flash device 104 to the controller 106. A hardware reset line 136 is provided to the controller 106 to provide a signal to the controller when the processor system 100 (and computer or other device in which the processor system 100 is situated) is reset or powered on from an off state.

External SDRAM 108 is coupled to the processor bus 120 by a bi-directional bus 140 and thus can communicate with the processor 102. The SDRAM 108 is typically an externally-packaged component that is coupled to the processor 102 by an appropriate interface; however, the SDRAM can be provided in other connections or configurations in other embodiments. Typically, the processor 102 reads the OS code 116 from the serial flash device 104 and writes it to the SDRAM 108, where random accesses are allowed so that the OS code 116 can be executed much more efficiently. Being volatile, the SDRAM 108 loses its data upon power down of the system, so that the memory controller 106 must again be used to retrieve the data from the serial is flash device 104 upon power up or reset.

Processor system 100 can be coupled to a variety of other components included in a computer system, electronic device, or other apparatus which uses the processor system 100. Additional processors (microprocessors, application specific integrated circuits, etc.), memory (RAM and/or ROM), storage capability (disk drive, optical disk, etc.), and input/output (I/O) components (network interface, input devices, output devices), can all be coupled to or controlled by the processor 102, as is well known.

In an alternate embodiment, an external bus controller (EBC) can be provided between the processor 102 and the controller 106. The EBC can be used to control various components on an internal bus to which the processor 102 is connected. The EBC can provide read and write cycles to an external bus, which is coupled to the controller 106, in place of the direct processor bus 120. The processor reset line 126 can be still connected between processor 102 and controller 106; or, the line 126 can be connected between the EBC and the memory controller.

Figure 3:
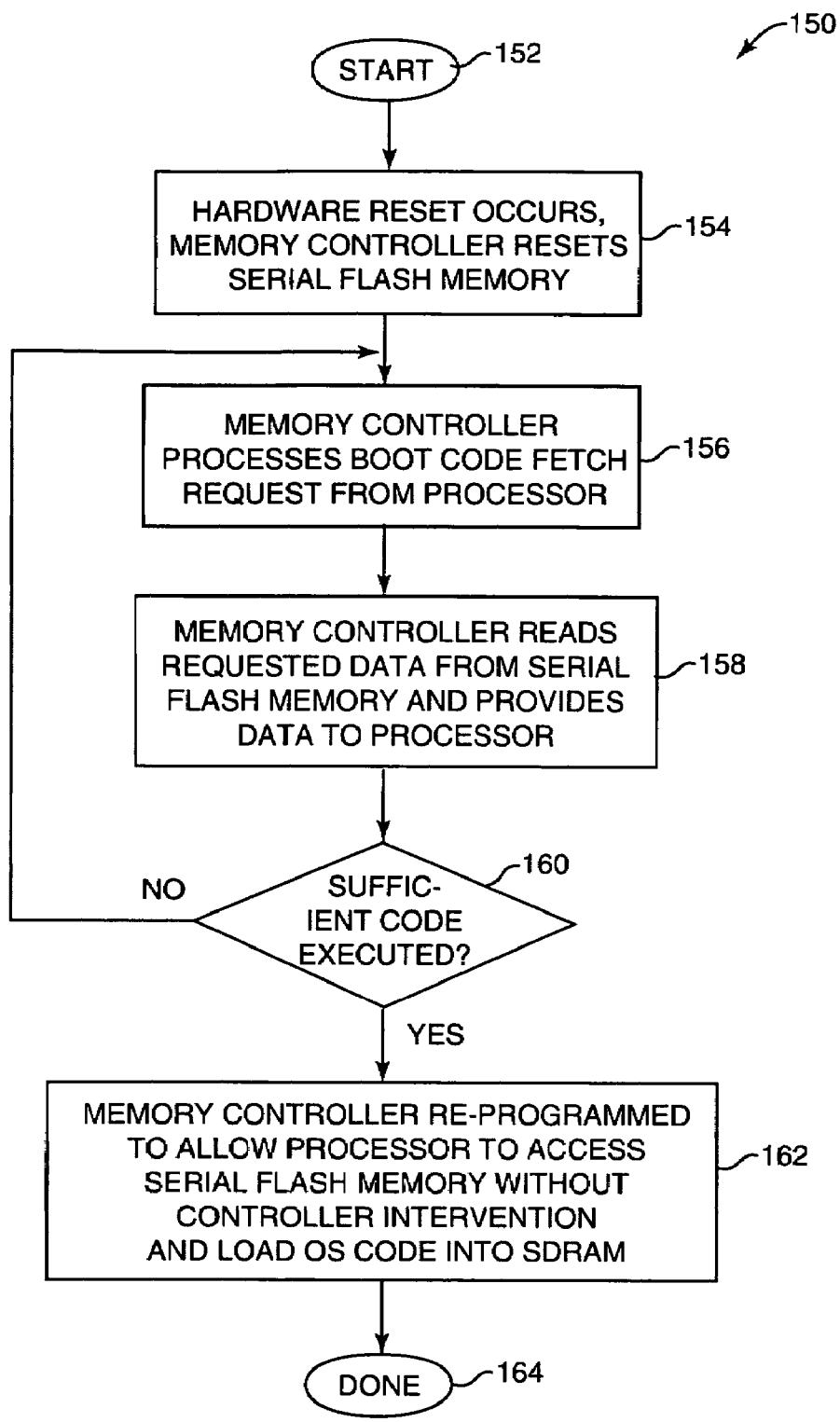
FIG. 3 is a flow diagram illustrating a method of the present invention for loading processor boot code from a serial flash memory.

FIG. 3 is a flow diagram illustrating a method 150 of the present invention for providing boot code and operating system code from a serial flash memory device. Method 150, as well as the other methods described herein, are preferably implemented in hardware (logic gates, circuit components, etc.). For example, the operations taken by the memory controller 106 can be provided by logic hardware within the controller block 106 of FIG. 1. Alternatively, these methods, or parts thereof, can be implemented using program instructions (software, firmware, etc.) that can be executed by a processor or circuit and are stored on a computer readable medium, such as memory, hard drive, optical disk (CD-ROM, DVD-ROM, etc.), magnetic disk, etc.

The method 150 begins at 152, and in step 154, a hardware reset occurs, and the memory controller 106 resets serial flash memory device 104, thus preparing it for system initialization. A "hardware reset" or "system reset", as referred to herein, can be a change in state of the processor system 100 from powered-off to powered-on; or a hardware reset switch may have been activated (e.g., by a user of a computer system) to provide a "cold" start; or a "warm" start, which is a reset that is initiated from a high-level operating system or program which does not fully reset all the components of the system. The controller 106 receives a signal on reset line 136 indicating that it is released from hardware reset state and may start performing boot-up or initialization operations. The initial preparations performed by the controller 106 include readying the processor 102 and the serial flash memory device 104, and is described in greater detail with respect to FIG. 4.

In step 156, the controller 106 receives a code fetch request from the processor 102 and processes this request. This request is for the boot-code stored in the serial flash memory which the processor needs to execute to initialized the system. The processor, however, may not know the specialized commands needed to read data from any particular section of the serial flash device 104, since the processor does not necessarily know the type of memory being used to store the boot code. The memory controller 106 therefore must process the fetch request to set the proper read mode and to read from the proper code block section of the serial flash device 104. This process is described in greater detail with respect to FIG. 5.

In step 158, the controller 106 reads the appropriate data of the boot code from the serial flash memory device 104 and provides the data to the processor 102. During this step, the controller may translate the processor's request to into the proper read command and address needed for the serial flash device. This process is described in greater detail below with respect to FIG. 6.

In step 160, it is checked whether sufficient boot code has been retrieved and executed by the processor 102 to facilitate the initialization of other chip-level and board-level resources and to accomplish the loading of the operating system code 116. This can occur after the entire boot code has been fully read and executed by the processor. In other embodiments, however, the boot code may be split into different portions, such as an initial program loader (IPL) and secondary program loader (SPL), as described with respect to FIG. 8. In such an embodiment, sufficient boot code has been retrieved when the IPL code has been retrieved and executed, after which the processor is able to retrieve the SPL boot code and store it and execute it from its own processor cache 103. If sufficient code has not been retrieved and executed in step 160, then the process returns to step 156 where the processor sends another boot code fetch request to the controller 106.

If sufficient boot code has been executed by the processor in step 160, then in step 162 the controller 106 is re-programmed to allow software executed by the processor, such as device drivers that have been included in the boot code, to access the serial flash device 104 without controller 106 intervention and to load the operating system code (and any other needed code or data, such as other boot code portions, e.g., an SPL) into SDRAM or other storage (such as processor cache 103). Such software knows how to address and read data from the serial flash device 104. For example, part of the boot code received and executed by the processor can include an operating system code loading routine which includes a serial flash memory device driver. This device driver knows how the serial flash memory is organized, and can read the OS image 116 from the serial flash device 104 and write the image to the SDRAM 108 using bus 140. The OS image can in some embodiments be stored in a compressed form in the serial flash device; if so, then the OS code loading routine can include functions to uncompress the OS code and load the uncompressed code into the SDRAM.

The described process is then complete at 164. Typically, after step 164, the processor executes the OS instructions that are loaded into the SDRAM 108 to configure and initialize the rest of the processor system and other devices as required. Such execution is fast, since the SDRAM efficiently allows random accesses to the memory that are needed for jumps and loops in the OS code. Or, the processor loads the remainder of boot code, such as SPL boot code, from the serial flash device to its own cache and executes the instructions in fast random-access fashion therefrom.

FIG. 4 is a flow diagram illustrating step 154 of FIG. 3, in which a hardware reset has occurred and the controller 106 prepares the processor 102 and serial flash device 104 in the boot-up procedure. The process begins at 202, and in step 204, the controller 106 asserts and maintains a reset signal to the processor on reset line 126, where the line 126 is connected to the processor's reset input. While this signal is asserted, the processor will be prevented from making code fetch requests, since the processor will still be in a reset state.

In step 206, the controller 106 issues a reset command to the serial flash device 104 on command line 130. This command resets the serial flash device and puts it into a known idle state. This is necessary in case the serial flash device was previously left in a programming or erasing state. Once the serial flash device gets the reset signal, it begins its reset operation.

In step 208, it is checked whether the serial flash device reset operation is complete. This is known by the state of the busy signal which the serial flash device sends to the controller on status line 132. While the busy signal is in its "busy" state, the serial flash device is still performing its reset operation, and the process loops back to step 208 to again check the reset operation state. When the busy signal is no longer asserted, the serial flash device reset is complete, and the process continues to step 210. In step 210, the controller releases the processor reset by de-asserting the reset signal on line 126, since the serial flash device is now ready to accept read commands and the processor can begin sending fetch requests. The process is thus complete at 212.

In some embodiments, the process 154 can be performed only if the appropriate "strap" signal or setting has been enabled, thus allowing an application to turn on or off the ability of the processor 102 to boot from the NAND-Flash device. If turned off, for example, then boot code can be loaded from a traditional Flash device, ROM, etc., and the processor reset signal 126 would not be asserted.

FIG. 5 is a flow diagram illustrating step 156 of FIG. 3, in which the memory controller 106 receives and performs part of the processing for a code fetch request from the processor. The process begins at 220, and in step 222, the processor sends a code fetch request to the controller on the processor bus 120. The code fetch request includes an address at which the processor wishes to read the boot code in the memory holding the code. For example, the low-order bits of this address are used by the controller 106 as an offset into the serial flash boot code section 112. The processor is configured to read the first instruction of the boot code after a system reset.

In step 224, the reset vector detector 107 of the controller 106 checks whether the processor's code fetch request is a reset vector code fetch. A reset vector code fetch is the initial boot-code fetch after a system reset, where the processor is requesting the boot code to enable its start-up operations. Typically, a processor will always make the reset vector code fetch to the same address and will always be requesting a specific data size, like a cache line size. To check whether the fetch is a reset vector, the controller compares the address and the fetch size of the data being requested to an expected processor reset vector fetch operation. If the processor request matches a reset vector fetch, then the controller 106 assumes that it is a reset vector fetch. If it is not a reset vector fetch, the process is complete at 232. If it is a reset vector fetch, then the process continues to step 226, where Auto-Read mode is automatically enabled on the controller. Auto-Read mode is a mode of the memory controller 106 that causes the memory controller to automatically translate addresses received from the processor to addresses appropriate to access boot code stored in the serial flash device 104; i.e., to issue read commands to the serial flash device when the processor is requesting boot code at start-up. This process is described in greater detail with reference to FIG. 6.

In next step 228, the process checks if the received reset vector fetch request is the first reset vector that has been seen by the controller 106 (since the controller was released from hardware reset). If so, the process is complete at 232. If this is not the first reset vector that has been seen, then in step 230 the controller increments the base boot-code block selector to point to a backup copy 114 of the boot code or a secondary boot code set 114 stored in the serial flash device 104. For example, the original or first copy of the boot code may include errors as detected by the processor, so that the processor would send another reset vector to access a backup copy of the boot code, stored as boot code 114, which may not contain the errors. Or, the processor may send a second reset vector because it has been configured to load a different boot code set which is appropriate to a particular state (such as a warm reset), environment, or mode of the processor, where the different boot code set is stored as boot code set 114. The controller treats the start of the next boot code set as the base address of the boot code to be read by the processor. Thus, third or later boot code sets or copies can be similarly selected by the processor sending additional reset vector requests. The process is then complete at 232.

Figure 6:
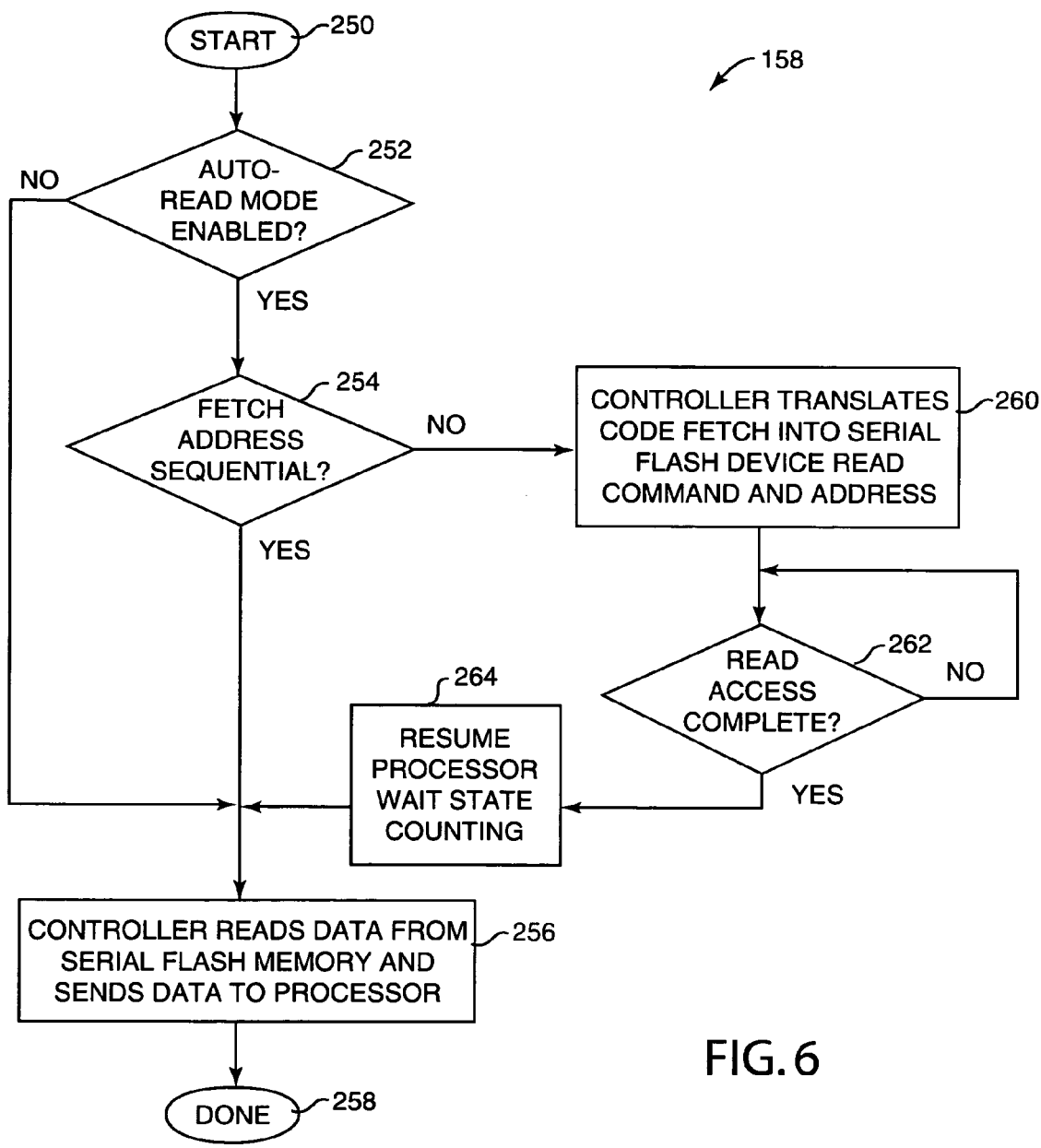
FIG. 6 is a flow diagram illustrating a step of the method of FIG. 3 in which the memory controller reads the requested data from the serial flash memory device and provides that data to the processor.

FIG. 6 is a flow diagram illustrating step 158 of FIG. 3, in which the memory controller 106 reads the requested data from the serial flash memory device 104 and provides that data to the processor 102. The process starts at 250, and in step 252, it is checked whether Auto-Read mode is enabled. As described with reference to FIG. 5, Auto-Read mode is enabled when a reset vector fetch is received by the controller from the processor, indicating that the processor is fetching boot code for initial start-up. If Auto-Read mode is not enabled, then boot code has been sufficiently executed by the processor and software running on the processor, such as a device driver, is desiring to access other data in the serial flash memory, such as the OS code 116 or an SPL section of boot code. Since such software includes a device driver for the serial flash device, it knows how and where to access the block addresses and data, so that the controller can simply allow the request to go straight through to the serial flash device as a data read cycle without issuing new read commands (a device driver, for example, may have software timer loops or a polling of the busy line in order to wait the page read access time when accessing the NAND-Flash device). Thus, if Auto-Read mode is not enabled, the process continues to step 256, where the controller reads data from the serial flash device 104 at the requested address over data bus 134 and provides the retrieved data to the processor over processor bus 120, and the process is complete at 258.

If Auto-Read mode is enabled at step 252, then in step 254 it is checked by the sequential address detector 109 of the controller 106 whether the address of the code fetch request is sequential to the last fetch request, i.e., whether the current fetch request is for data that is stored in the serial flash device just after the data retrieved for the most recent fetch request. The controller compares the address of the current request with the most recent read cycle address to determine if they are sequential. The most recent address can be retrieved from convenient storage, such as a register of the controller 106 (the address would have been written to such storage previously, e.g. in step 260, below). For example, if the most recent previous request address is for four bytes of data starting at 0xFFF01000 (hexadecimal), and the current request address is for data starting at 0xFFF01004, then the current request is sequential to the last request.

If the current request address is sequential, then the process continues to step 256, in which the controller reads data from the serial flash device 104 over the data bus 134 according to the request, and then sends the retrieved data to the processor over the processor bus 120, and the process is complete at 258. It should be noted that the first time the processor makes a fetch request, the request address will always be found to be non-sequential, since any previous request addresses have been cleared from storage after the last system reset.

It is also possible that the current request is sequential to the most recent previous request, but fulfilling that current request would retrieve data from an area of the serial flash device which is a separate storage area not intended to be contiguous with the previous page addresses of the serial flash memory. For example, the "spare/extended" data area of a serial flash device may be such an area. The spare/extended area is an area at the end of every page of serial flash memory storage which is typically used to store data that is not associated with program code, such as error checking and correction (ECC) values, page/block status codes, etc. The controller thus also detects whether a request address, while being numerically sequential to a previous request address, would access this separated area, and treats such a request as non-sequential to prevent the processor from fetching this data.

If the current request address is found to be not sequential in step 254 (i.e., a random-access request), then the process continues to step 260, where the controller stops the processor from counting wait states, and translates the processor request into a suitable read command and address for the serial flash device 104. Serial flash devices are controlled through commands instead of a simple SRAM interface, and thus must receive the specific commands telling them to start to read data and then receive a command address to tell where that data should be fetched from. Since it takes time for the serial flash device to receive and interpret the read command and address, the controller 106 asserts a gating signal (e.g., on a line of processor bus 120) to the processor 102 to make the processor stop counting wait states during this read cycle, so that the processor's read cycle will not time out due to the much longer access time needed for a page read access to a serial flash memory.

The controller translates the processor's address into a new read command and address usable by the serial flash device, and sends that command and address to the serial flash device to be acted upon. The translation is based on several parameters, including serial flash device "physical parameters" (data width, page size, etc.). An example of translating a processor request to a serial flash device command and address is described in greater detail with respect to FIG. 7. The parameters used in the translation can be provided to the controller 106 as fixed parameters for a specific serial flash device, or can be made adjustable or configurable by an assembler or user. For example, these parameters can be set by pin-strapping from the system external to the processor system 100, e.g. using pull-up or pull-down resistors as strap pins for configuring parameters. Other configuration methods can also be used. Also, in step 260, the controller preferably stores the processor's code fetch (request) address in convenient storage, such as its own registers, so that this fetch address can be compared to a later fetch address to determine if it is sequential, as in step 254.

In step 262, it is checked whether the read command access of step 260 is complete such that the serial flash device 104 has processed the read command from the controller and is ready to provide the data at the new address. A disadvantage of serial flash memory devices is that when a non-sequential piece of data is requested, there is a much larger page read access time (e.g., 50 microseconds) before the new data is available. The serial flash device drives a "busy" indicator signal on the status line 132 until the desired page of data is available for reading. The time that this process takes is typically known as the "page read access time." Once the serial flash device has dropped its busy indicator, data can be read from the serial flash device in a sequential fashion for up to an entire device page size. Thus, in step 262, the controller checks to see if the busy signal from the serial flash device 104 has been de-asserted. Furthermore, a predetermined timeout value can be provided for the controller and a timer started when the read command is first provided to the serial flash device. If the timer reaches the timeout value before detecting the de-assertion of the busy signal, then the read command is assumed to be complete and the desired data available for reading. If the read access is not complete in step 262, the process returns to step 262 to make the same check (any other appropriate steps or functions can be performed while this check recurs).

Once the read access is complete and the serial flash device is ready, then the process continues to step 264 where the controller resumes the processor wait state counting by de-asserting the gating signal, allowing the processor to resume counting read cycle wait states. The process then continues to step 256 to read the data at that address and provide it to the processor, as described above.

EXAMPLE EMBODIMENTS

Figure 7:
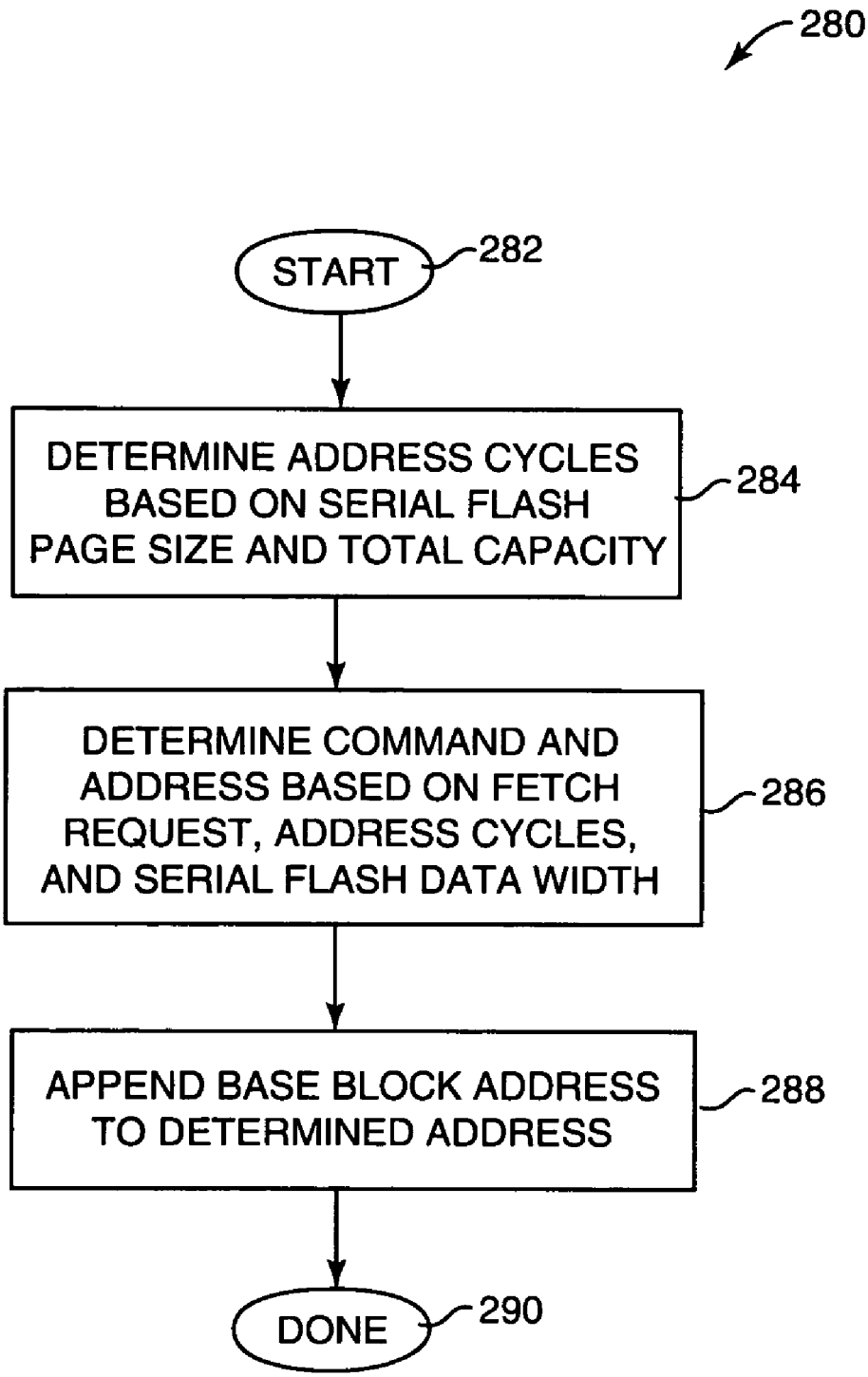
FIG. 7 is a flow diagram illustrating the translation of a processor request into a command and address for the serial flash memory device.

FIG. 7 is a flow diagram illustrating an example method 280 for a portion of step 260 of FIG. 6, in which a processor fetch request is translated by the controller 106 to a read command and address usable by the serial flash memory device 104. This method assumes the controller 106 has access to the physical parameters of the serial flash device. The specifics for this process can vary depending on the specific components used in an embodiment.

The process begins at 282, and in step 284, the number and type of address cycles to be used is determined based on the page size of the serial flash device and on the total capacity of the serial flash device. Each address cycle provides a portion of the total address data to the serial flash device, and the serial flash device may need multiple such cycles. For example, a row address can select a page in the serial flash device, and a column address can select the byte within a page. The number of column address cycles can be based on the page size of the serial flash device, e.g., more column cycles are used for a greater page size. The number of row cycles can be based on the total serial flash device capacity, e.g., more row cycles are used for a greater number of pages in the serial flash device. This step may have been performed previously for previous fetch requests, and since page size and total capacity do not change, may only need to be performed again when a different serial flash device 104 is coupled to controller 106.

In step 286, the read command and address for the serial flash device is determined based on the processor fetch request, on the address cycles of step 284, and on the data width of the serial flash device. For example, a command is chosen based on whether the device data width is 8 bits or 16 bits (8-bit standard NAND-Flash devices, for example, use a different command from 16-bit devices). Some embodiments may require multiple commands to be sent, e.g., if a larger page size is used, such as a 2 kilobyte page size (instead of a 512-byte page size). For example, a command can be sent to the serial flash device, followed by the address data, followed by a second command to start the page read access. The same command(s) are always generally used with a particular type or model of serial flash memory device.

The address can be determined based on the fetch request address and on the device data width, and is organized based on the particular address cycles used as determined above. For example, the first column cycle can be formed from the least significant bits of the received processor address, the second column cycle from the bits next to the first column bits, etc., with appropriate bits included or excluded based on the device data width. Likewise, the row address cycles can be formed from more significant bits in the request address than the cycle bits. For example, the command and address format can be <command0>, <column0>, <column1>, <row0>, <row1>, <row2>, <command1>, where the appropriate commands and row/column cycles are used for the particular serial flash device used.

In step 288, a base block address is appended to the address determined in step 286 to determine where the base page is located in the serial flash device where the boot code is to be accessed, i.e., the beginning address to which the serial flash addresses are referenced. As described with reference to FIG. 2, different sets of boot code in the serial flash device 104 can be accessed using different base page addresses. For example, the base block address value can be appended to the upper portion of the first row cycle address.

The process is then complete at 290. The translated command(s) and address are sent to the serial flash device as explained above with reference to step 260 of FIG. 6.

FIG. 8 is a timing diagram 300 illustrating the timing of various signals used in an example embodiment of the present invention using a NAND-Flash memory device as serial flash device 104. Signals used in this example implementation of the invention are labeled on the left side of the diagram and are referred to in the text below. Areas which correspond to the various steps of the invention in the above figures are shown and labeled at the bottom of the diagram with the respective matching steps in the figures.

When implementing step 154 of FIG. 3, the input system reset signal SYS_RESET is initially asserted, and then de-asserted when the reset is complete. The memory controller 106 can sample pin-strapped signals for configuration information to determine its configuration. Once the SYS_RESET signal is released, the controller issues the reset command to the NAND-Flash device and drives the SYS_RESET_OUT signal high to the processor's reset input to maintain the processor in the reset state until the NAND-Flash device reset is complete, at which point the SYS_RESET_OUT signal is de-asserted. The controller reads the ready/busy signal RDYBSY to determine if the NAND-Flash device is still busy; that signal is low to indicate the NAND-Flash device is still in reset state, and goes high when the NAND-Flash is ready. If the controller does not detect the de-assertion of the busy signal of the NAND-Flash device, the controller can wait for the expiration of a configurable number of clock cycles (e.g., the equivalent of more than 500 microseconds in some embodiments) before automatically assuming the NAND-Flash device reset is complete. CE_N[0] is the NAND-Flash device's chip select/chip enable signal.

The processor then makes its first boot code fetch to get a reset vector by sending a request address on the address bus ABUS. In this example, the address is 1FF8 (hexadecimal). The controller receives the processor's reset vector request, and since this request is non-sequential (it being the first request), translates the request address to a NAND-Flash command/address using NAND-Flash parameters that can be provided to the controller via pin-straps or other configurable inputs. The non-sequential status is indicated by the NON_SEQ signal of the controller being high. For example, the number of NAND-Flash address cycles, NAND-Flash address width, and base page address can be provided to the controller to allow a translation similar to the one described with reference to FIG. 7. The controller sends this translated read command and address to the NAND-Flash device via the bus DATA_BUS, where the data on the data bus are interpreted by the NAND-Flash as commands when the CLE (Command Latch Enable) signal is asserted, and interpreted as address(es) when the ALE (Address Latch Enable) signal is asserted. WE_N is the write enable (active low) pin on the NAND-Flash and is asserted when the DATA_BUS[0.7] value is being written to the NAND-Flash device. The controller also asserts the signal GATE_CLK to the processor (or EBC) to block the processor or EBC from counting wait states during the time that the controller is waiting for the serial flash device to become ready.

The controller waits for the RDYBSY signal to go high again, indicating that the NAND-Flash device is now ready for data retrieval (or the controller waits for a predetermined number of clock cycles to expire; for example, 50 microseconds can be allowed for the NAND-Flash device read command to be complete in an embodiment that pertains to most current types of NAND-Flash devices). Once the RDYBSY signal is detected as high, the controller de-asserts the GATE_CLK signal to allow the processor or EBC to resume counting wait states for the read cycle.

The controller then reads (in this example) four bytes of data from the NAND-Flash device, shown as bus DATA_BUS. The four bytes assumes in this example that the processor and/or EBC has a 32-bit wide read request. RE_N is the read enable (active low) pin on the NAND-Flash device and is asserted when data is desired from the NAND-Flash device on the bus DATA_BUS. The READY signal is then asserted to the processor or EBC by the memory controller to signal that data is to be sent, and then provides this data to the processor or EBC on the data bus, shown as signal DBUS. The controller waits until the processor accepts the data and ends the read cycle by either asserting a new read address (indicating a new read request) or by de-asserting the OE_N signal and/or the CS_N signal, which are connected to the processor or EBC.

The processor then sends another read address request on ABUS, which is 1FFC. Since this address is sequential from the location of the most recent data read (i.e., four bytes after address 1FF8), the controller need only read the next four bytes of data from the NAND-Flash device without having to issue any new read commands. The READY signal is asserted by the controller to the processor/EBC when the data is to be sent to the processor, and the controller will wait for the processor/EBC to end the read cycle.

The controller will continue to compare processor address requests with the most recent request addresses until the controller is brought out of Auto-Read mode by a signal or command from the processor.

In some embodiments, the boot code can include a small initial program loader (IPL), and a larger secondary program loader (SPL). In such an embodiment, after system reset, the controller is put in Auto-Read mode to translate addresses while the processor is loading the IPL, as in the processes described above. However, once the processor has loaded all the IPL, it knows enough to intelligently access the NAND-Flash memory directly without needing the controller to automatically issue read commands. Thus, the processor can take the controller out of Auto-Read mode with the appropriate control signal, and start reading the SPL code from the NAND-Flash memory.

At this stage, after the IPL code has been executed and the SPL code has been loaded by the processor into an on-chip cache, the processor execution jumps to the start of the SPL code. The SPL code includes the board and application-specific code necessary to initialize more major chip sub-sections, such as SDRAM 108, and can also be responsible for loading the OS image 116 from the serial flash device 104 to the main memory such as SDRAM 108. The SPL thus can include a portion of the serial flash file system device drivers and may also support the decompression of a compressed OS image.

Once the OS is loaded into SDRAM or other main memory, then the processor execution can jump to the OS code and begin the configuration and initialization of the rest of the chip and system as required.

The embodiments of the present invention thus allow a processor to make non-sequential, random-access requests to a serial flash memory device, such as a NAND-Flash device, when retrieving boot code upon initial start-up of the processor system. The system can thus take advantage of the high storage capability of NAND-Flash without having to include additional costly memory devices such as SRAM, and without having to store boot code in a sequential fashion according to the order of processor requests.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for loading boot code from a serial flash memory, the method comprising:
   (a) receiving a code fetch request from a processor, the code fetch request requesting a portion of boot code to be executed by the processor;
   (b) translating the code fetch request into a memory request providing random access to the serial flash memory, and sending the memory request to the serial flash memory; and
   (c) receiving the portion of boot code read from a randomly-accessed portion of the serial flash memory and providing the portion of boot code to the processor.

2. The method of claim 1 wherein the memory request includes a read command and an address, wherein the portion of boot code is read at the address in the serial flash memory.

3. The method of claim 1 wherein the step of translating the code fetch request is performed only if the code fetch request is a random-access code fetch request, such that the portion of boot code is not stored sequentially to a last portion of boot code retrieved from the serial flash memory.

4. The method of claim 3 further comprising checking whether the code fetch request is a reset vector fetch such that it is a first processor fetch since a system reset occurred, and if the code fetch request is a reset vector fetch, automatically performing the step of translating the code fetch request into a read command and an address for the serial flash memory.

5. The method of claim 4 further comprising checking whether the reset vector fetch is a first reset vector fetch to be received since the system reset occurred, and incrementing a boot code block selection such that a different boot code stored in the serial flash memory is accessed if the reset vector fetch is the first reset vector fetch.

6. The method of claim 3 wherein the step of translating the code fetch request is not performed after the processor has read sufficient portions of boot code from the serial flash memory to perform initialization of resources of the processor system and to accomplish the loading of other data from the serial flash memory without requiring the translation step.

7. The method of claim 6 wherein the other data loaded from the serial flash memory includes operating system code, wherein the operating system code is retrieved from the serial flash memory and stored in a random-access external memory.

8. The method of claim 6 wherein the other data loaded from the serial flash memory includes additional boot code that is retrieved from the serial flash memory and stored in a cache of the processor.

9. The method of claim 2 wherein after the read command and address is sent to the serial flash memory, further comprising waiting for a ready signal from the serial flash memory indicating that it is ready to be accessed for retrieval of boot code at the address.

10. The method of claim 9 wherein if the ready signal from the serial flash memory is not detected within a predetermined amount of time after sending the read command and address, then assuming that the serial flash memory is ready to be accessed for retrieval of boot code at the address.

11. The method of claim 9 wherein during the translation and sending step, a signal is sent to the processor to delay the counting of wait states for the read cycle of the code fetch request until the serial flash memory is ready to be accessed for retrieval of boot code.

12. The method of claim 2 wherein the translation step includes using physical parameters of the serial flash memory to translate the code fetch request into a read command and address.

13. The method of claim 12 wherein the physical parameters of the serial flash memory used to translate the code fetch request include the page size of the serial flash memory, the data width of the serial flash memory, and the number of address cycles required for the serial flash memory.

14. The method of claim 1 wherein the translation step includes using a base block address of the boot code stored in the serial flash memory to translate the code fetch request into a read command and address.

15. The method of claim 3 further comprising:
   sending a signal to the serial flash memory to put the serial flash memory into a known state; and
   sending a reset signal to the processor to prevent the processor from making the code fetch request until the serial flash memory is in the known state.

16. The method of claim 3 wherein the code fetch request is received from an external bus controller which is in communication with the processor over a bus.

17. A method for loading boot code for a processor system, the method comprising
   (a) enabling an auto-read mode for a memory controller after reset of the processor system, the auto-read mode allowing the memory controller to control sequential and random accesses from a processor to a serial flash memory that stores the boot code; and (b) disabling the auto-read mode of the memory controller when sufficient boot code has been retrieved and executed by the processor to allow the processor to retrieve and store other data from the serial flash memory.

18. The method of 17 wherein the random accesses are controlled by the memory controller by translating an access request from the processor into a read command and an address and sending the read command and address to the serial flash memory to access data not sequentially stored to data retrieved for the most recent previous access to the serial flash memory.

19. The method of 17 wherein the sequential accesses are controlled by the memory controller by reading the data sequentially stored to data retrieved for the most recent previous access to the serial flash memory.

20. The method of claim 17 wherein the other data retrieved from the serial flash memory is operating system code to implement an operating system.

21. The method of claim 18 wherein the operating system code is written to an external random-access memory by the processor.

22. The method of claim 17 wherein the other data retrieved from the serial flash memory includes additional boot code that is stored in a cache of the processor.

23. The method of claim 18 further comprising checking whether an access request from the processor is a reset vector fetch, being a first processor access since a system reset occurred, and if the access request is a reset vector fetch, automatically performing the translation of the access request into a read command and an address for the serial flash memory.

24. The method of claim 23 further comprising checking whether the reset vector fetch is a first reset vector fetch to be received since the system reset occurred, and incrementing a boot code block selection such that a different boot code stored in the serial flash memory is accessed if the reset vector fetch is the first reset vector fetch.

25. The method of claim 18 wherein the translation of the access request includes using physical parameters of the serial flash memory.

26. The method of claim 18 wherein the translation of the access request includes using the base block address of the boot code stored in the serial flash memory.

27. A processor system comprising:
a processor;
a serial flash memory device that stores boot code for initializing the processor system after a system reset; and
a memory controller coupled between the processor and the serial flash memory device, the memory controller operative to provide data from the serial flash memory device to the processor in response to sequential- and random-access boot-code fetch requests sent by the processor, wherein when the boot-code fetch request is a random-access boot-code fetch request, the memory controller translates the boot-code fetch request into a memory request providing random access to the serial flash memory device and receives data read from a randomly-accessed portion of the serial flash memory device.

28. The processor system of claim 27 wherein the memory controller includes a sequential address detector that detects whether a boot-code fetch request requests data that is sequential to data requested by a previous boot-code fetch request.

29. The processor system of claim 28 wherein if the boot-code fetch request is a random-access boot-code fetch request, the memory controller translates the boot-code fetch request into a read command and an address for the serial flash memory device.

30. The processor system of claim 27 wherein the memory controller includes a reset vector detector that detects whether a boot-code fetch request from the processor is a reset vector fetch that is a first processor access to the serial flash memory device since a system reset occurred, such that if the boot-code fetch request is a reset vector fetch, the memory controller automatically translates the boot-code fetch request into a read command and an address for the serial flash memory device.

31. The processor system of claim 27 wherein the serial flash memory device stores a plurality of boot code sets, wherein one of the boot code sets can be selected by the processor to be executed.

32. The processor system of claim 27 wherein the serial flash memory device is a NAND-Flash memory device.

33. The processor system of claim 27 further comprising an external random-access memory device, wherein the processor retrieves other code from the serial flash memory device and stores the other code in the external random-access memory device after a particular amount of boot code has been executed by the processor.

34. The processor system of claim 33 wherein the external random-access memory device is an SDRAM device.

35. The processor system of claim 33 wherein the other code includes operating system code.

36. The processor system of claim 27 wherein the memory controller is coupled to the serial flash memory device by a ready signal line, wherein after the read command and address is sent to the serial flash memory device, the memory controller waits for a ready signal on the ready signal line from the serial flash memory device indicating that the serial flash memory device is ready to be accessed for data retrieval.

37. The processor system of claim 36 wherein the memory controller is coupled to the processor by a processor bus and a gating line, wherein a signal is sent to the processor on the gating line to delay the processor counting wait states for the read cycle of a boot-code fetch request until the serial flash memory device is ready to be accessed for data retrieval.

38. The processor system of claim 27 further comprising an external bus controller coupled between the processor and the memory controller, wherein the boot-code fetch request is provided by the external bus controller which is in communication with the processor.

39. A memory controller for facilitating the loading of boot code from a serial flash memory, the memory controller comprising:
means for receiving a code fetch request from a processor, the code fetch request requesting a portion of boot code to be executed by the processor;
means for translating the code fetch request into a memory request providing random access to the serial flash memory, and sending the memory request to the serial flash memory; and
means for receiving the portion of boot code read from a randomly-accessed portion of the serial flash memory and providing the portion of boot code to the processor.

40. The memory controller of claim 39 wherein the memory request includes a read command and an address, wherein the portion of boot code is read at the address in the serial flash memory.

41. The memory controller of claim 39 wherein the means for translating the code fetch request only translates if the code fetch request is a random-access code fetch request, such that the portion of boot code is not stored sequentially to a last portion of boot code retrieved from the serial flash memory.

42. A processor system comprising:

a processor;

a serial flash memory device that stores boot code for initializing the processor system after a system reset; and a memory controller coupled between the processor and the serial flash memory device, the memory controller operative to provide data from the serial flash memory device to the processor in response to sequential- and random-access boot-code fetch requests sent by the processor, and wherein the memory controller includes a sequential address detector that detects whether a boot-code fetch request requests data that is sequential to data requested by a previous boot-code fetch request.

43. The processor system of claim 28 wherein if boot-code fetch request is a random-access boot-code fetch request, the memory controller translates the boot-code fetch request into a read command and an address for the serial flash memory device.

44. A processor system comprising:

a processor;

a serial flash memory device that stores boot code for initializing the processor system after a system reset, wherein the serial flash memory device stores a plurality of boot code sets; and a memory controller coupled between the processor and the serial flash memory device, the memory controller operative to provide data from the serial flash memory device to the processor in response to sequential- and random-access boot-code fetch requests sent by the processor, and wherein one of the boot code sets stored by the serial flash memory device is selected by the processor to be executed.

* * * * *